(12) United States Patent
Mauthner et al.

(10) Patent No.: US 7,384,668 B2
(45) Date of Patent: Jun. 10, 2008

(54) CCVD METHOD FOR PRODUCING TUBULAR CARBON NANOFIBERS

(75) Inventors: Klaus Mauthner, Grafenstein (AT); Erich Leister, Vienna (AT); Ernst Hammel, Vienna (AT)

(73) Assignee: Electrovac, Fabrikation Elektrotechnischer Spezialartikel Gesellschraft m.b.H., Klosterneuberg (AT)

( * ) Notice: Subject to any disclaimer, the term of this patent is extended or adjusted under 35 U.S.C. 154(b) by 593 days.

(21) Appl. No.: 10/471,523

(22) PCT Filed: Feb. 12, 2002

(86) PCT No.: PCT/AT02/00048

§ 371 (c)(1),
(2), (4) Date: Sep. 10, 2003

(87) PCT Pub. No.: WO02/075018

PCT Pub. Date: Sep. 26, 2002

(65) Prior Publication Data

US 2004/0081758 A1    Apr. 29, 2004

(30) Foreign Application Priority Data

Mar. 16, 2001  (AT)  ................. A 421/2001

(51) Int. Cl.
C23C 16/00    (2006.01)
(52) U.S. Cl. ................. 427/249.1; 427/248.1; 977/778; 977/843
(58) Field of Classification Search ............. 427/248.1, 427/249.1
See application file for complete search history.

(56) References Cited

U.S. PATENT DOCUMENTS

| 3,617,343 | A |   | 11/1971 | Lechenich et al. |
| 3,892,890 | A |   | 7/1975 | Watanabe et al. |
| 5,026,601 | A | * | 6/1991 | Iio et al. ................. 428/336 |
| 5,079,040 | A |   | 1/1992 | Brandenburger |
| 5,780,101 | A |   | 7/1998 | Nolan et al. |
| 6,129,901 | A | * | 10/2000 | Moskovits et al. ...... 423/447.3 |
| 6,448,701 | B1 | * | 9/2002 | Hsu ......................... 313/309 |

FOREIGN PATENT DOCUMENTS

DE    198 33 593    1/2000

(Continued)

OTHER PUBLICATIONS

Cheol Jin Lee et al. "Syntheses of uniformly distributed carbon nanotubes on a large area of Si substrate by thermal chemical vapor deposition" Applied Physics Letters vol. 75, N. 12, Sep. 20, 1999 pp. 1721-1723.*

(Continued)

Primary Examiner—Timothy Meeks
Assistant Examiner—David Turocy
(74) Attorney, Agent, or Firm—Merchant & Gould P.C.

(57) ABSTRACT

The invention relates to a CCVD method for producing tubular carbon nanofibers on a support by catalytically depositing carbon out of the vapor phase. The inventive method is characterized in that a catalyst layer, which is deposited without current and which is based on nickel or cobalt, is applied to the support at least in places. Said catalyst layer is thermally activated before depositing carbon out of the vapor phase in a reducing atmosphere.

15 Claims, 4 Drawing Sheets

FOREIGN PATENT DOCUMENTS

Figure 1:
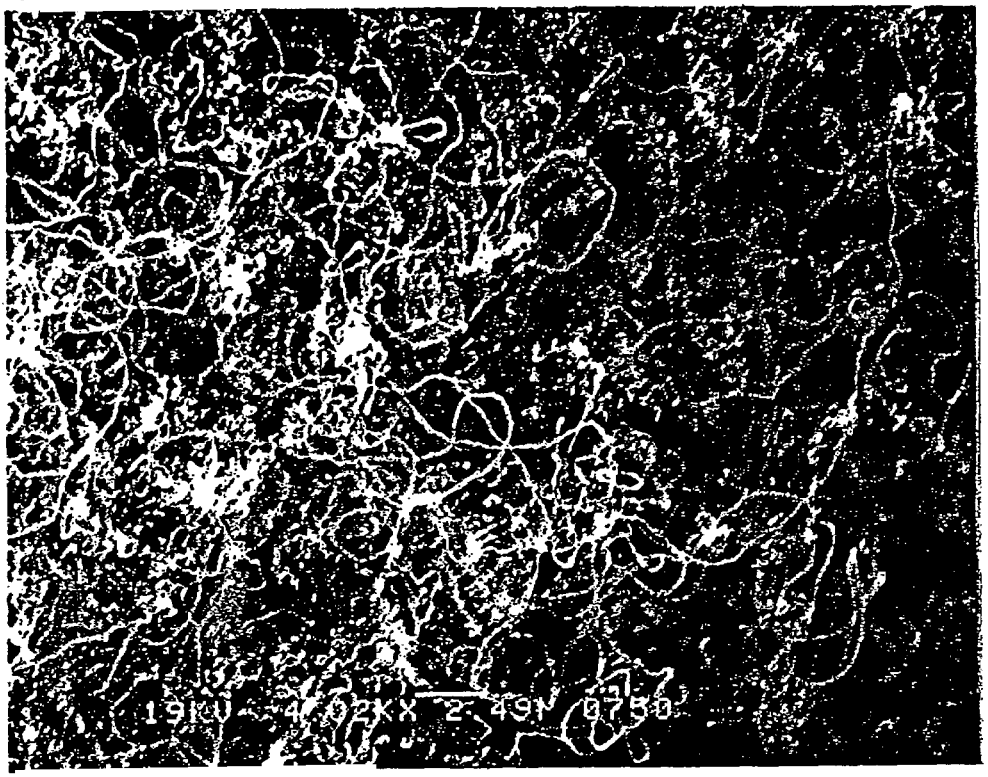

| | | |
|---|---|---|
| EP | 1 059 266 A2 | 12/2000 |
| EP | 1 061 041 | 12/2000 |
| EP | 1061041 A1 * | 12/2000 |
| EP | 1 072 693 | 1/2001 |
| EP | 1 129 990 | 9/2001 |
| GB | 824090 | 11/1959 |
| JP | 02274881 | 11/1990 |
| JP | 02274881 * | 4/1998 |

OTHER PUBLICATIONS

J. M. Mao et al. "Growth of carbon nanotubes on cobalt disilicide precipitates by chemical vapor deposition" Applied Physics Letters, vol. 72, No. 25, Jun. 22, 1998, pp. 3297-3299.

Cheol Jin Lee et al. "Synthesis of uniformly distributed carbon nanotubes on a large area of Si substrates by thermal chemical vapor deposition" Applied Physics Letters vol. 75, N. 12, Sep. 20, 1999, pp. 1721-1723.

* cited by examiner

CCVD METHOD FOR PRODUCING TUBULAR CARBON NANOFIBERS

The invention relates to a CCVD method (catalytical chemical vapor deposition) for producing tubular carbon nanofibers on a support by catalytic deposition of carbon from the gaseous phase.

In 1991, S. Iijima discovered highly ordered tubular carbon structures in soot which was produced by arc discharge between carbon electrodes. The knowledge of the complete structure of fullerenes led him to the conclusion that these tubes consist of cylindrical, concentrically interlaced graphite tubes around a hollow core, the ends of which are closed in themselves by fullerene structures. Extensive examinations of said graphite structures showed that there were two different species, i.e. nanotubes with multiple walls (MWCNT) as originally reported by Iijima, and nanotubes with simple walls which had a diameter of approximately 1.5 nm and represented a kind of tubularly extended fullerenes.

The perfection of this material caused researchers to investigate its properties for possible practical applications. Due to its well-ordered structure, model calculations soon showed the superior electrical, mechanical and chemical properties of carbon nanotubes, in agreement with the first experiments.

As has already been described in many articles and patents, it is intended to supply tubular carbon nanofibers, also termed carbon nanotubes, to a plurality of technical applications, such as, e.g., ultra-light fiber reinforcement in composite materials, in slip agents and lubricants or as an electrically/thermally conductive component in synthetic materials.

Within the last 10 years a large number of synthesis methods has been suggested for the production of carbon nanotubes. It is, however, apparent that most of the methods have been derived from standard methods for producing catalytically grown carbon fibers. This particularly applied to the catalytic property of some transition metals to extrude "fiber-shaped carbon", as soon as they are exposed to carbon residues existing in the gas/vapor phase. Already in the 50ies, thus, the elements of the iron group, Fe, Co and Ni, were described as being catalytically active.

It has long been known that nickel at elevated temperatures forms the most metastable carbide $M_3C$ of the iron group elements and precipitates carbon nanofilaments in case of a carbon supersaturation. Therefore, nickel inter alia also in the form of alloys is described as a widely used catalyst in the carbon nanotube synthesis.

U.S. Pat. No. 3,982,890 A relates to a method of producing crystalline carbon coats by means of CVD (chemical vapor deposition), which carbon coats tightly adhere to a support, a Ni/P (4-12% by mass of phosphorus) coat being currentless deposited on the support prior to the CVD method.

This patent specification reports the currentless electrochemical deposition of {Ni,P} layers in a layer thickness ranging from 0.1 to 6 μm on an iron or iron-coated support, phosphorus always being co-enclosed in the deposited catalyst coating due to the composition of the bath. To allow for a crystalline C layer to be deposited thereupon, care must be taken not to keep the applied catalyst layer too long at an elevated temperature in a non-carbon-containing environment so as to prevent an alloy formation by diffusion and thus, a deactivation of the catalyst. The said temperature is in the range between 450 and 700° C., the maximum annealing time at 600° C. is indicated to be 10 minutes under an oxygen partial pressure of 0.1 torr, the action of $O_2$ serving for an activation. Therefore, this is an activation in an oxidating atmosphere. To furthermore prevent diffusion processes between the Ni layer and the Fe substrate, the CVD reaction temperature should be reached within the shortest time; this means heating from room temperature to reaction temperature within 5 minutes. There are no more detailed structural characteristics regarding the crystalline carbon layers prepared according to this patent specification, except for the layer thickness of a few μm. Thus, it is at least doubtful whether or not tubular carbon nanofibers can be obtained with the above-mentioned method according to U.S. Pat. No. 3,892,890 A.

According to the present invention, a method of the initially defined-kind is characterized in that a currentless deposited, nickel or cobalt-based catalyst layer is applied on the support at least in parts thereof, which is thermally activated in a reducing atmosphere before the deposition of carbon from the gaseous phase. Surprisingly, it has been shown that the activating step in a reducing atmosphere results in a substantially higher yield of carbon nanobifers as compared to the prior art so that the inventive method is useful for the production of tubular carbon nanofibers on an industrial scale. In some instances, the length of the carbon nanofibers even reached the mm-range, the total yield of tubular carbon nanofibers from the gaseous phase, relative to the carbon used, under non-optimized conditions was about 30%. Since the yield also depends on the degree to which the furnace space is used (the more catalytically active area offered per space element in the hot zone, the better the utilization of the gas), it is provided for the synthesis of large, commercially usable amounts of carbon nanofibers to load the hot zone of the furnace with catalyst-loaded support plates stacked at a space of from 1 to 3 cm. At the optimum reaction duration, this arrangement allows for a total yield of tubular carbon nanofibres from the gas phase of up to 80%, based on the carbon used. The optimum reaction duration is an empiric parameter which is determined by i) the loading density of the furnace hot-zone with catalyst-coated support plates, ii) the gas flow velocity, iii) the temperature and iv) the concentration of the gaseous carbon component of the gas/gas mixture flowing through the reactor.

According to a preferred embodiment of the present invention it is provided for the reducing atmosphere to respectively comprise a hydrogen-containing or hydrogen-yielding gas mixture. In this instance, $H_2$/inert gas, ammonia and ammonia/inert gas may, e.g., be used as the gas mixtures. By providing a reducing, i.e. hydrogen-containing, atmosphere, a further enhancement of the catalytic activity of the inventively used catalytically active material will result. Without being restricted to one theory, it is assumed that by the presence of hydrogen which dissolves at an elevated temperature in transition metals, diffusion procedures in the solid will be facilitated, and residual oxygen contents will be eliminated, respectively such diffusion procedures may, however, also contribute to a finer grain size in the solid.

Preferably it is provided for the thermal activation to be carried out at a temperature ranging from 350 to 700° C. Especially in this temperature range, the activity of the catalyst used is particularly increased. Higher temperatures will lead to a denser layer and to a sintering together of the catalyst layer, lower temperatures reduce the solubility of the hydrogen in the metal and thus, the diffusion procedures in the solid, and the reduction of residual oxygen contents, respectively.

It is furthermore suitable if the support has at least in parts centers of an increased surface energy on its surface prior to the application of the catalyst layer. Such centers may, e.g., be provided by the controlled removal of parts of the surface, and by working out crystallographically defined areas, edges and tips can be provided which represent such centers of an increased surface energy. The currentless deposition of the catalyst layer will then proceed preferably at these centers, or is possible at all at these centers.

According to a preferred embodiment, the support at least in parts consists of $Al_2O_3$ or a ceramics inert under the reaction conditions chosen, there materials optionally also being pickled, or etched, respectively, at least in parts thereof. Furthermore, the support may consist, at least in parts thereof, of etched glass or etched glass ceramics. Diverse chemical and physical etching methods are available as treatment methods for the surface of the substrate. The most commonly used etching medium for glass and glass ceramics is HF which is used as an aqueous solution or in the form of pastes. If an etching paste is applied to the support by means of screen printing, micro-structuring of the surface of the substrate may already be achieved in this step, and thus a complex photolithography is not required. As examples of physical etching methods which i.a. can especially be used with ceramics, plasma etching or RIE (reactive ion etching) should be mentioned. When using ceramics layers on a glass support it is suitable to apply a thin layer of fluxing agent (e.g. MgO) or coupling agent to the glass so as to ensure a good layer adhesion to the isolating support glass/material during a possible annealing step.

Alternatively, the support may also have a layer at least in parts of its surface which contains centers of increased surface energy. In this case, the support itself may be made of any material; problems known from the prior art as regards the diffusion of undesired metal atoms from the support into the catalyst layer are prevented by providing such an additional layer, and at the same time the above-mentioned advantages of providing centers of increased surface energy as defined by the invention are utilized.

In this connection it is, furthermore, suitable if the layer at least in parts thereof has a compound selected from $TiO_2$, TiN, $Ta_3O_5$, $Al_2O_3$, $SiO_2$, SiC, SiN and AlN. The layer thus may consist either entirely of the compounds mentioned, or the said compounds can be incorporated as discrete crystallites into a suitable inert matrix (e.g. of glass powder or of a sub-microcrystalline material). A further advantage of such substrate (?) layers resides in their specific electric resistances which, when using the deposited tubular carbon nano-fibers, may be used as field electron emitters so as not to overcharge the emitting tubular carbon nano-fibres with current.

Preferably, the layer is applied by means of CVD or PVD (physical vapor deposition), such layers may also be applied to the support by spray techniques known in the prior art, by screen printing or by sputtering (?). According to a further embodiment of the method according to the invention, the catalyst layer comprises a currentless deposited, phosphorus-doped nickel layer which preferably contains 0.1 to 12% by mass of phosphorus. The phosphorus content may be purposefully reduced or adjusted to a desired value by an oxidating step preceding the inventive activating step in a reducing atmosphere, whereby an increased porosity of the catalyst layer or of the catalyst material, respectively, can be provided.

Moreover, it is particularly suitable if the support is provided with a palladium seeding prior to the currentless deposition of the catalyst layer, the nickel or cobalt-based catalyst layer subsequently being deposited on this seeding in the form of a catalyst-nanostructure without the use of a current so as to provide catalyst nanoparticles. In particular, on electrically insulating substrates, the catalyst layer provided according to the invention can mostly be applied only after a preceding Pd-seeding which also must be applied without the use of a current. Catalyst nanoparticles generated in this manner exhibit an unexpectedly high activity for the growth of tubular carbon nanofibers.

What is essential for the activity of the catalyst used according to the invention, besides the specific properties of the nickel or cobalt, respectively, under suitable reaction conditions, is to separate graphitic carbon filaments, particularly the doping of the same with phosphorus, on the one hand and, if desired, the seeding of the support material with palladium preceding the deposition of the catalyst layer, on the other hand.

By such an intentional seeding of the support material with palladium after a suitable surface treatment of the support surface or surface layer of the support, respectively, it has become possible for the first time to pre-define the distances between the individual emitting carbon structures on the surface of the support itself, which distances are required for the use of carbon nanotubes/tubular nanofibers prepared according to the invention as field electron emitters. As has already been mentioned, the micro-/sub-microcrystalline structure of the support material preferably is provided by the controlled removal of parts of the surface, edges and tips being provided by the working out of crystallographically defined areas, which edges and tips represent centers of increased surface energy. At these centers, the Pd is almost exclusively separated from a Pd salt solution, the palladium seeding obtained thereby being a prerequisite for the currentless application of the nickel- or cobalt-based catalyst nanostructrue. A further advantage of this type of catalyst application resides in the controllability of the catalyst particle size in dependence on the respective duration of separation. This is of particular importance insofar as the carbon nanotube/fiber diameter will directly depend on the particle size of the catalyst.

Carbon-containing gases or carbon-containing substances, respectively, which exist in the vapor/gas phase, are provided as the carbon source for the CCVD method described here for producing tubular carbon nanofibers by catalytic deposition of carbon from the gaseous phase. Under ambient conditions, gaseous carbohydrates, preferably those having C—C multiple bonds, prove to be suitable. In order to counteract a possible autopyrolysis inherent in the nature of the gas/gas mixture used under the CCVD reaction conditions prevailing, it is suitable to dilute the carbon-containing substances with inert gases commonly used in the prior art (Ar, $N_2$, $H_2$, etc.) or with gases which do not cause any undesired side reactions in the indicated method (light carbohydrates, CO, $CO_2$, etc.).

Figure 2:
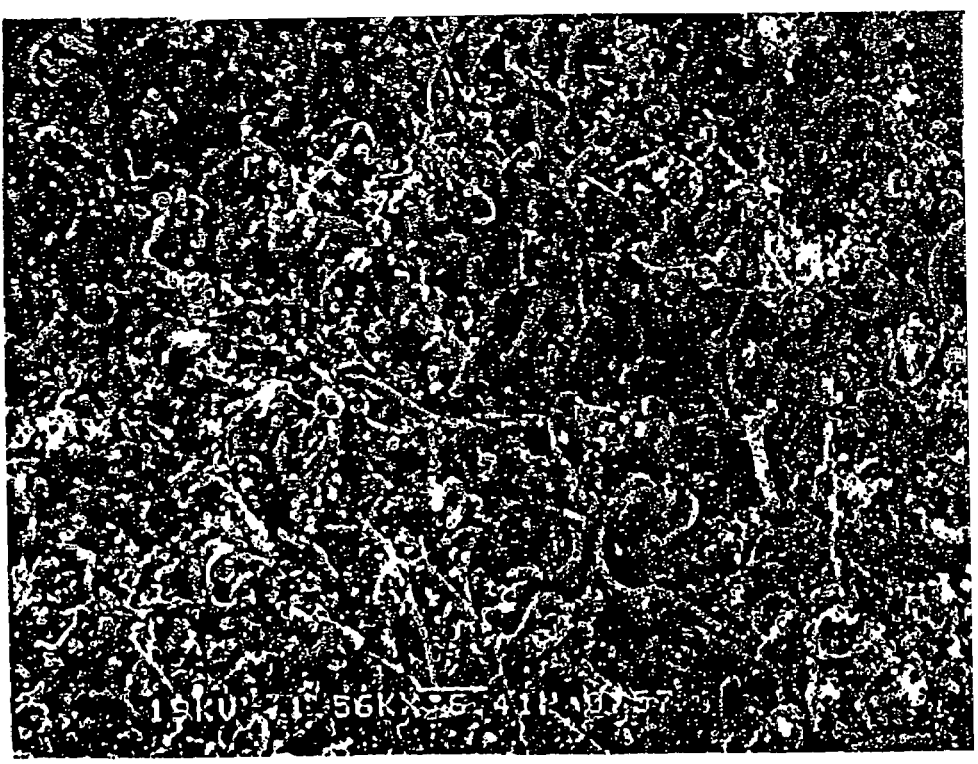

The Figures show:

FIG. 1: an SEM (scanning electron microscope) image of tubular carbon nanofibres produced according to Example 1 (30 seconds of Pd bath and 30 seconds of Ni bath), 80% of the fibers have a diameter of between 100 and 120 nm;

FIG. 2: an SEM image of tubular carbon nanofibers produced according to Example 1 (30 seconds of Pd bath and 3 minutes of Ni bath), the diameter distribution of the nanofibers in this Example is flatter and in the range of from 200 to 700 nm.

Figure 3:

FIG. 3: An illustrative example of the method according to the invention (Example 1) for the commercial mass production of tubular carbon nanofibers is shown. Eight catalyst-coated plates (250×100×1 mm) were inserted in the furnace according to Example 1 in a steel tray and tubular carbon nanofibers were grown thereon according to the method indicated in Example 1. The yield of this Example was 140 g (3.5 g per 100 $cm^2$).

Figure 4:
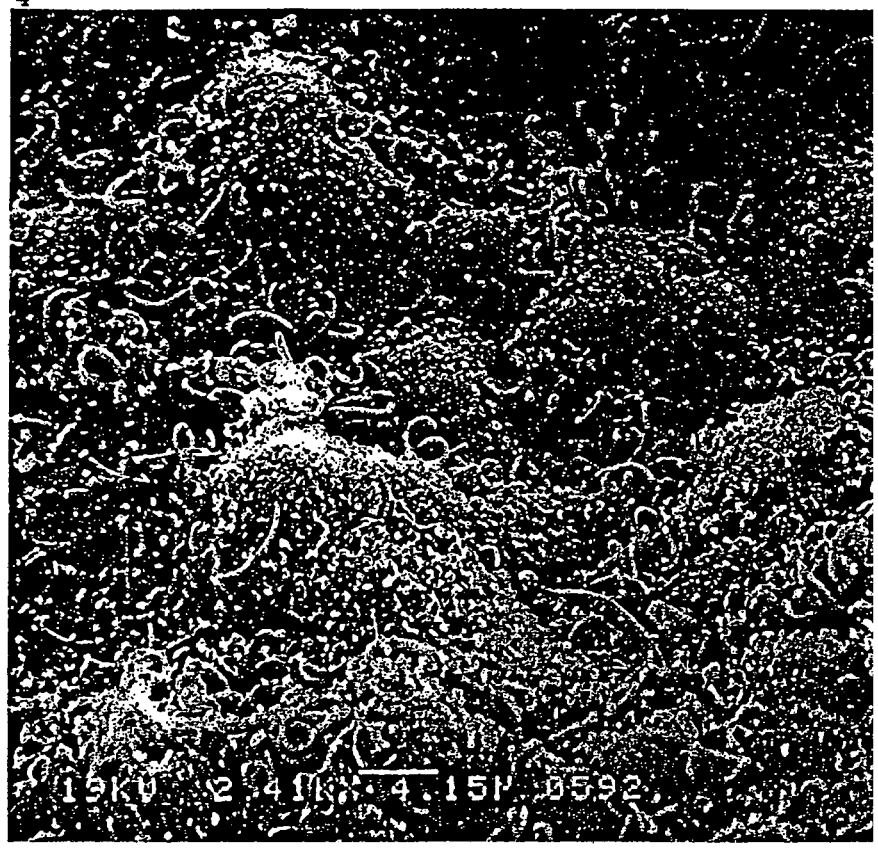

FIG. 4: An SEM image of a carbon-nanofiber field emission cathode prepared according to the method of the invention (Example 2). Even though they are not oriented in any preferential direction, the tubular carbon nanofibers have a sufficient distance between the individual fiber ends so that the electric fields forming at the tips when an electric voltage is applied do not interfere and thus yield a uniform electron emission over the entire area.

Figure 5:
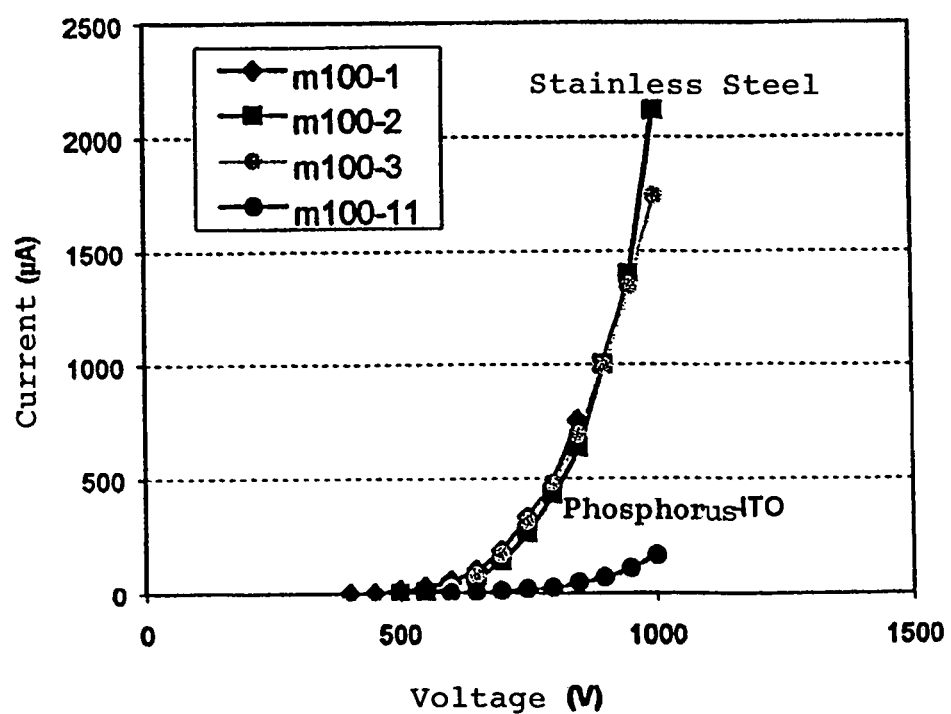

FIG. 5: I/V (current/voltage) characteristic of an emission cathode with tubular carbon nanofibers prepared according to the method of the invention (Example 2). The electrode distance is 150 μm, the anode is made of polished special steel, and the emitting area is 1 cm². The flat curve was obtained against a luminescence anode coated with blue phosphorus/ITO.

Figure 6:
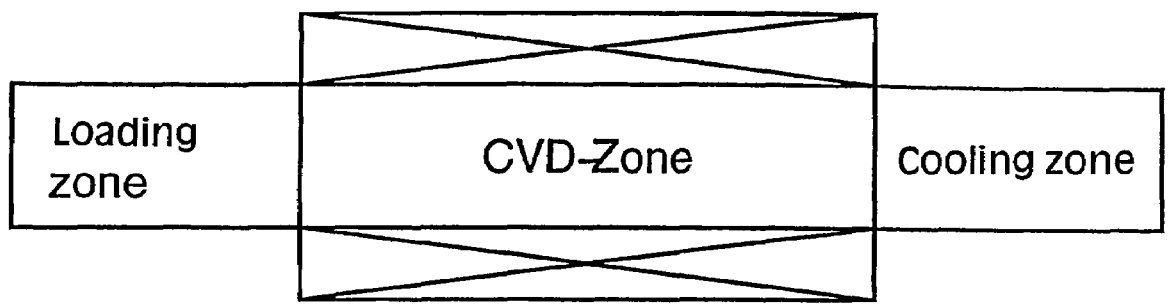

FIG. 6: Diagrammatic structure of a furnace construction for preparing tubular carbon nanofibers in a continuous operation. Loading and cooling zones are partitioned from the CVD zone and kept under inert gas. CVD gases (C precursor, $H_2$) are only fed into the CVD zone.

The present invention will now be described in more detail by way of the following examples to which, however, it shall not be restricted. The Pd bath used is obtained in the form of a concentrate from Schloetter GmbH & Co. KG, D-73312 Geislingen, Germany (Article No. AN 180 120). The Ni bath is Electrovac GmbH's own development based on a hypophosphite, wherein the phosphorus portion in the precipitate can be controlled in dependence on the pH value.

EXAMPLE 1

$Al_2O_3$ plates (180×125×0.65 mm) were pickled in thick lye (NaOH 50%) at 80° C. and rinsed with Aqua dest. The thus-prepared plates were immersed for 30 seconds in a commercially available $Pd^{2+}$ bath, the deposition of tightly placed metallic Pd islands on the etched ceramics surface by the development of $H_2$ bubbles being observed after approximately 8 seconds. Subsequently, a nickel-based, phosphorus-doped catalyst layer was electrochemically applied without a current to the sites of the surface thus pre-treated with Pd. The P content in the Ni layer applied was about 8% in this case, the layer thickness is controlled via the dwell time in the bath which, depending on the desired carbon nanofiber quality and amount can be between a few seconds and a few minutes (cf. FIGS. 1,2). It should be pointed out that with shorter dwell times in the bath (up to 3 minutes), a continuous homogenous layer formation will not occur. The catalyst-provided plates are then heated in the tubular furnace (d=230 mm, length of hot zone=800 mm) under an argon hydrogen mixture to 650° C. (heat-up rate=10° C./min), and are annealed at this temperature in the Ar/$H_2$ flow for 1.5 hours. After this time, a gas mixture comprised of ethylene, hydrogen and argon in a mixture of thirds (flow rate ~1.5 liters/min) was blown into the furnace for 1.5 hours. After having been cooled to room temperature under inert gas, the support plates with the fibers grown thereon are removed from the reactor (FIG. 3).

The yields of tubular carbon nanofibers are dramatically dependent on the amount of catalyst applied which also influences the diameter distribution of the fibers obtained. With support plates on which Pd is deposited for 30 seconds and Ni is deposited for 3 minutes, 3-8 g of nanofibers are obtained per 100 cm² substrate area (FIG. 2). If the dwell time in the Ni bath is reduced to 30 seconds, only 1-2 g will be obtained per 100 cm² fiber material in the same time which, however, will be of a better quality (FIG. 1).

EXAMPLE 2

Glass ceramics (Foturan®, Schott, Germany) having the dimensions 15×15×1 mm is etched for 15 seconds in diluted hydrofluoric acid and subsequently covered with catalyst in the Pd bath for 15 seconds and in the Ni bath for 30 seconds. Nanotube growth was carried out in a tubular furnace (quartz tube, d=25 mm, l=1000 mm, length of hot zone=400 mm). The heating rate and the gas composition were chosen analogous to Example 1, merely the activation time and CVD duration were shortened to 30 and 15 minutes, respectively, and the temperature was set at 600° C. (FIGS. 4, 5).

The invention claimed is:

1. A CCVD method for producing tubular carbon nanofibers on a support by catalytic deposition of carbon from the gaseous phase, wherein before applying the catalyst layer, centers of increased surface energy are created on a surface of a support, at least in parts thereof in a previously applied layer, wherein the previously applied layer at least in parts thereof comprises a compound selected from the group consisting of $TiO_2$, TiN, $Ta_3O_5$, $SiO_2$, SiC, SiN and AlN worked into a suitable inert matrix as discreet crystallites, and then a currentless deposited nickel- or cobalt-based catalyst layer is applied at least in parts thereof, which is thermally activated in a reducing atmosphere before carbon is deposited from the gaseous phase.

2. A method according to claim 1, the centers of increased surface energy are created by the controlled removal of parts of the surface.

3. A method according to claim 1, wherein the reducing atmosphere comprises a hydrogen-containing or hydrogen-supplying gas mixture.

4. A method according to claim 1, wherein the thermal activation is carried out at a temperature ranging from 350 to 700° C.

5. A method according to claim 1, wherein the support comprises at least in parts thereof $Al_2O_3$ or a ceramics inert under the reaction conditions.

6. A method according to claim 5, wherein the ceramics material is pickled or etched at least in parts thereof.

7. A method according to claim 1, wherein the support at least in parts thereof comprises etched glass, or etched glass ceramics.

8. A method according to claim 1, wherein the previously applied layer is applied by CVD.

9. A method according to claim 1, wherein the previously applied layer is applied by PVD.

10. A method according to claim 1, wherein the previously applied layer is applied by a spraying technique.

11. A method according to claim 1, wherein the previously applied layer is applied by screen printing.

12. A method according to claim 1, wherein the previously applied layer is applied by sputtering.

13. A method according to claim 1, wherein the catalyst layer comprises a currentless deposited, phosphorus-doped nickel layer.

14. A method according to claim 13, wherein the nickel layer contains from 0.1 to 12% by mass of phosphorus.

15. A method according to claim 1, wherein before the currentless deposition of the catalyst layer, the support is provided with a palladium seeding by currentless deposition, the nickel- or cobalt-based catalyst layer subsequently being deposited without using a current on the seeding in the form of a catalyst nanostructure so as to provide catalyst nanoparticles.

* * * * *

UNITED STATES PATENT AND TRADEMARK OFFICE
CERTIFICATE OF CORRECTION

PATENT NO. : 7,384,668 B2
APPLICATION NO. : 10/471523
DATED : June 10, 2008
INVENTOR(S) : Mauthner et al.

It is certified that error appears in the above-identified patent and that said Letters Patent is hereby corrected as shown below:

On the title page, item [73] should read:

(73) Assignee: Electrovac, Fabrikation

Elektrotechnischer Spezialartikel

Gesellschaft m.b.H., Klosterneuburg (AT)

Signed and Sealed this

Second Day of December, 2008

JON W. DUDAS
*Director of the United States Patent and Trademark Office*